United States Patent
Usui et al.

(10) Patent No.: US 8,253,928 B2
(45) Date of Patent: Aug. 28, 2012

(54) EXPOSURE APPARATUS AND DEVICE MANUFACTURING METHOD

(75) Inventors: Yoshiyuki Usui, Utsunomiya (JP); Shinichi Hirano, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 461 days.

(21) Appl. No.: 12/549,194

(22) Filed: Aug. 27, 2009

(65) Prior Publication Data

US 2010/0053587 A1    Mar. 4, 2010

(30) Foreign Application Priority Data

Sep. 1, 2008 (JP) ................... 2008-224172

(51) Int. Cl.
G03B 27/58 (2006.01)
G03B 27/62 (2006.01)

(52) U.S. Cl. .......................... 355/72; 355/75

(58) Field of Classification Search ............ 355/53, 355/55, 72–76; 356/399–401, 614
See application file for complete search history.

(56) References Cited

U.S. PATENT DOCUMENTS

| | | | |
|---|---|---|---|
| 6,400,445 B2 * | 6/2002 | Nishi et al. | 355/72 |
| 2002/0089655 A1 * | 7/2002 | Kida et al. | 355/72 |
| 2005/0018168 A1 * | 1/2005 | Akutsu et al. | 355/72 |
| 2007/0159615 A1 * | 7/2007 | Horiuchi | 355/72 |

FOREIGN PATENT DOCUMENTS

JP    11-124230 A    5/1999

* cited by examiner

Primary Examiner — Hung Henry Nguyen
(74) Attorney, Agent, or Firm — Canon USA Inc. IP Division

(57) ABSTRACT

An exposure apparatus for exposing a substrate to radiant energy includes: a stage including a chuck, and configured to hold the substrate on the chuck with vacuum and to be moved; a recovery device configured to recover the substrate from the stage; a first detector configured to detect an error of holding of the substrate on the chuck; a measuring device configured to measure an amount of positional deviation of the substrate relative to the chuck; and a controller configured to cause the measuring device to measure the amount of positional deviation in a case where the first detector detects the error, and to control an operation of the stage such that the amount of positional deviation falls within a tolerance based on the measured amount.

7 Claims, 9 Drawing Sheets

EXPOSURE APPARATUS AND DEVICE MANUFACTURING METHOD

BACKGROUND OF THE INVENTION

1. Field of the Invention

The present invention relates to an exposure apparatus used in a photolithography process for manufacturing a device, such as a semiconductor integrated circuit, a liquid crystal display device, or the like.

2. Description of the Related Art

When processing process wafers with a semiconductor exposure apparatus, the wafers carried in from the outside by an open cassette elevator or a coater developer are conveyed by conveying units and are brought to a wafer stage by a wafer loading hand. At this time, due to vibration of the apparatus generated when the wafer loading hand passes the wafers to the wafer stage or due to the shape or machining condition of the process wafers, a wafer chuck may suck the wafers on the wafer stage with a deviation exceeding the tolerance, causing a wafer vacuum error on the holding surface of the chuck.

In a known art, in such a case, the apparatus cannot accurately identify the amount of deviation, and, if the apparatus is driven, the wafers and the apparatus may be damaged. Thus, the wafers are recovered manually. Japanese Patent Laid-Open No. 11-124230 discloses that a positioning pin is installed on a conveying arm, and, upon the occurrence of a conveyance error of a substrate, the substrate is pressed against the positioning pin and is aligned with a predetermined position so that the deviated substrate is returned to a state capable of being automatically conveyed.

However, as in the above-mentioned known art, in order to recover the wafers manually, an operator has to touch the wafers through the spaces between the other units in the apparatus, making the manual recovery troublesome. Furthermore, the recovery of the wafers in the exposure apparatus disturbs the environment in the air-conditioned apparatus, and the operator may bring particles in the apparatus.

SUMMARY OF THE INVENTION

The present invention enables automatic recovering of a substrate in a case where an error occurs in holding of the substrate on a vacuum chuck.

The present invention in its first aspect provides an exposure apparatus for exposing a substrate to radiant energy includes: a stage including a chuck, and configured to hold the substrate on the chuck with vacuum and to be moved; a recovery device configured to recover the substrate from the stage; a first detector configured to detect an error of holding of the substrate on the chuck; a measuring device configured to measure an amount of positional deviation of the substrate relative to the chuck; and a controller configured to cause the measuring device to measure the amount of positional deviation in a case where the first detector detects the error, and to control an operation of the stage such that the amount of positional deviation falls within a tolerance based on the measured amount.

The present invention in its second aspect provides a method of manufacturing a device, the method including exposing a substrate to radiant energy using the exposure apparatus, developing the exposed substrate, and processing the developed substrate to manufacture the device.

The present invention enables automatic recovery of a substrate when an error occurs.

Other objects and advantages besides those discussed above shall be apparent to those skilled in the art from the description of a preferred embodiment of the present invention which follows. In the description, reference is made to accompanying drawings, which form apart thereof, and which illustrate an example of the present invention. Such example, however, is not exhaustive of the various embodiments of the present invention, and therefore reference is made to the claims which follow the description for determining the scope of the present invention.

Further features of the present invention will become apparent from the following description of exemplary embodiments (with reference to the attached drawings).

DESCRIPTION OF THE EMBODIMENTS

Embodiments of the present invention will be described below with reference to the attached drawings. Referring to an overall configuration in FIG. 1, a scanning exposure apparatus according to an embodiment of the present invention will be described. The present invention may be applied not only to the scanning exposure apparatus, but also to a non-scanning exposure apparatus that simultaneously expose a shot area without performing scanning.

Figure 1:
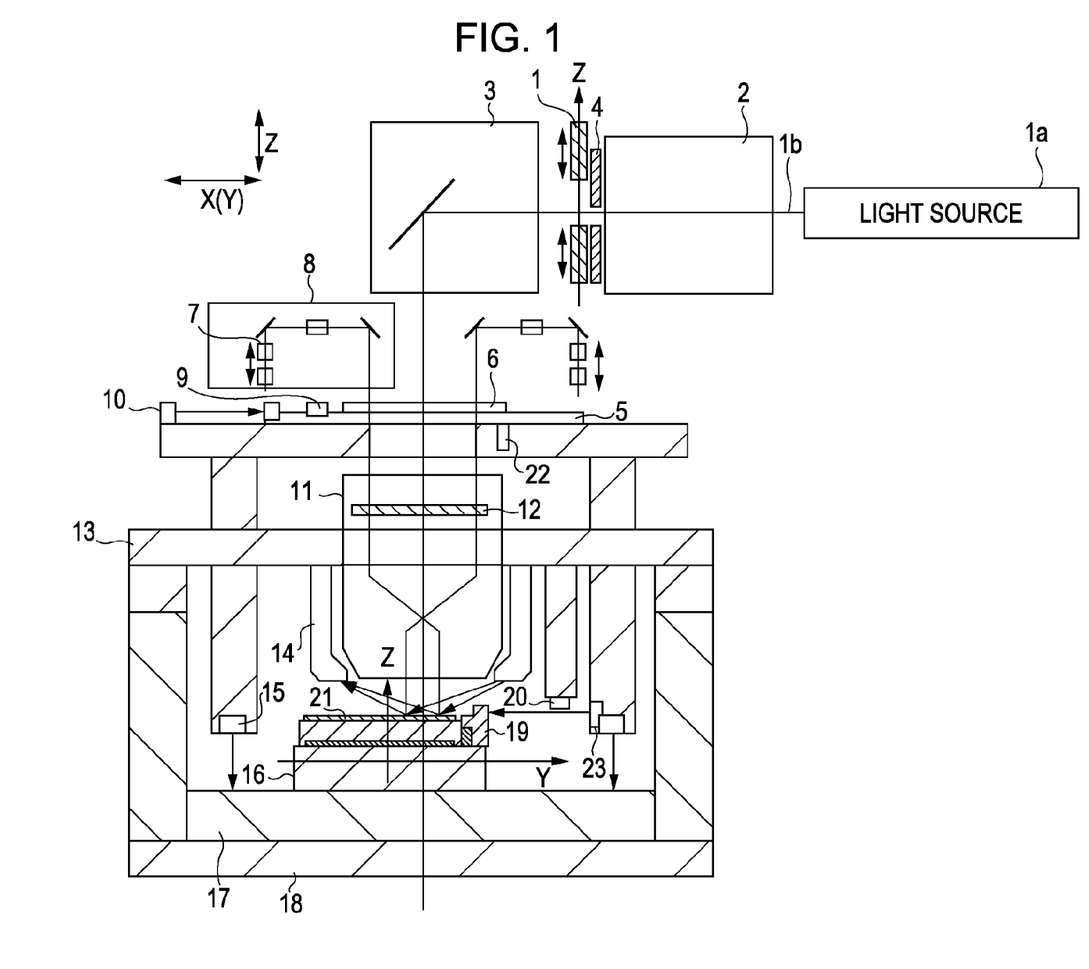
FIG. 1 shows an overall configuration of an exposure apparatus according to an embodiment.

The scanning exposure apparatus according to the embodiment of the present invention exposes a wafer 21, serving as a substrate. Exposure light 1b, such as an excimer laser, output from a light source portion 1a passes through a first condenser lens group 2 and reaches a slit 4.

The slit 4 narrows the exposure light 1b into a slit-like beam having a width of about 7 mm in the Z direction and adjusts it such that the illuminance integrated in the Z-axis direction is uniform in a predetermined range in the X-axis direction. When a reticle stage 5, serving as an original stage, and a wafer stage 16, serving as a substrate stage, are scanned and exposed, a masking blade 1 moves so as to follow an end of a pattern on a reticle 6, serving as the original. The wafer stage 16 includes a chuck 210 shown in FIG. 2 and moves while sucking the wafer 21 with vacuum.

The masking blade 1 prevents the exposure light 1b from being incident on a light transmission portion of the reticle 6 and prevents the wafer 21 from being exposed while the reticle stage 5 is slowed down after completion of the transfer of the pattern on the reticle 6. The exposure light 1b having passed through the masking blade 1 passes through a second condenser lens group 3 and is incident on the reticle 6 on the reticle stage 5. The exposure light 1b having passed through the pattern on the reticle 6 passes through a projection lens (projection optical system) 11 and forms an image of the pattern in the vicinity of a surface of the wafer 21. The projection lens 11 has an NA stop (a stop that limits the numerical aperture) 12 disposed therein, whereby the numerical aperture of the projection optical system can be changed.

A through-the-lens (TTL) scope 8 capable of one-dimensional movement measures the positions of alignment marks, in the X, Y, and Z-axis directions, formed on the reticle 6 and on the wafer 21 or a reference mark 19 on the wafer stage 16 with reference to the absolute position reference of the TTL scope 8. The relay lens 7 is used to adjust the focus of the TTL scope 8. By referring to the position of the relay lens 7 when the focus on the alignment mark is most accurate, the focus (the position in the Z-axis direction) of a detecting object can be measured.

Although, for the sake of the drawing, the exposure apparatus according to the embodiment shown in FIG. 1 has two TTL scopes 8 arranged in the Y direction, there is another TTL scope disposed at a position shifted in the X direction from these TTL scopes 8. The arrangement of the TTL scopes 8 and the arrangement of the reticle alignment mark as well as the wafer 21 or the wafer reference mark 19 enables ωx (angle of rotation about the x axis) and ωy (angle of rotation about the y axis) of the surface having the marks to be measured. The TTL scopes 8 shown in FIG. 1 can be driven toward the center of the angle of field (in the Y-axis direction).

The reticle stage 5 is controlled in X, Y, and ωz (angle of rotation about the z axis) directions by three reticle laser interferometers 10. Although only one reticle laser interferometer 10 is shown in this embodiment in FIG. 1, there are disposed two laser interferometers 10 for Y axis and one laser interferometer 10 for X axis in this embodiment. The reticle stage 5 is movable in the X, Y, and Z directions along a guide provided on a lens barrel base 13. The reticle stage 5 is movable over a long stroke distance along the Y axis to perform scanning exposure while moving in synchronization with the wafer stage 16, and is movable within a small range along the X and ωz axes because it is enough to correct an error occurring when the reticle stage 5 sucks the reticle 6.

The exposure apparatus according to this embodiment has a structure in which the reaction force generated by driving the reticle stage 5 is released to a reaction force absorber (not shown) that is fixedly connected to a base plate 18, whereby the vibration of the lens barrel base 13 due to the reaction is sufficiently attenuated. The reticle stage 5 carries a reticle reference plate 9, on which the mark that can be observed by the TTL scopes 8 is formed.

A focus detector 14 includes a light-emitting element, such as a laser diode, and a photo detector. The measuring light emitted from the light-emitting element is obliquely incident on the measurement object, and the reflection light forms a reflection light spot on a light-receiving surface of the photo detector. The position of the reflection light spot formed on the light-receiving surface varies depending on the position of the measurement object in the Z direction. That is, the focus detector 14 projects light onto the wafer 21 and detects the reflection light from the wafer 21 to locate a plurality of portions on the periphery (edge) of the wafer 21 on the basis of the detected reflection light.

Accordingly, for example, by measuring the center of gravity of the light-receiving spot, the position at which the light is projected on the surface of the wafer 21, in the Z direction, can be determined. By projecting light onto a plurality of portions in the vicinity of the edge of the wafer 21 using the focus detector 14, serving as a measuring unit, and then by performing a predetermined calculation on the basis of the amount of light received from the respective portions, the amount of deviation of the wafer 21 in the XY direction with respect to the chuck 210 can be determined. In this embodiment, the focus detector 14 is used to measure the amount of positional deviation of the wafer 21 in the XY direction with respect to the chuck 210.

The focus detector 14 measures the position (the position in Z, ωx, and ωy directions) of the reference mark 19 or the wafer 21 placed on the wafer stage 16 at a high speed, without using the projection lens 11. The focus detector 14 is used to detect the focus during exposure while performing synchronization scan on the reticle stage 5 and the wafer stage 16. To assure the long term stability of measurement accuracy, the focus detector 14 is calibrated by comparing the reference mark 19 on the wafer stage 16 measured by the TTL scopes 8 with that measured by the focus detector 14.

An off-axis scope 20 has a single-lens focus measurement function and an alignment error measurement function in the XY direction. When the wafer 21 is aligned in a normal mass production job, the off-axis scope 20 performs global tilt measurement and global alignment measurement. The amount of global tilt correction and the amount of global alignment correction are together measured before starting to expose the exposure areas (shots).

The lens barrel base 13 is a base to which the high-accuracy measuring device of the exposure apparatus according to this embodiment is attached, and is slightly floating in the air above the base plate 18 directly placed on the floor. Because the focus detector 14 and the TTL scopes 8 are attached to the lens barrel base 13, the measurement values of these measuring devices show the relative distances from the lens barrel base 13. An inter-base interferometer 15 measures the relative positional relationship between the lens barrel base 13 and the stage base 17.

In this embodiment, the sum of the measurement result of the inter-base interferometer 15 and the measurement result of a triaxial Z sensor (not shown) mounted on the wafer stage 16 is controlled to be equal to the target value instructed by a higher level sequence. This control allows the wafer 21 on the wafer stage 16 to be maintained with respect to the lens barrel base 13 so as to be equal to the target value in the focus (Z) direction instructed by the higher level sequence. Similarly to the interferometers for the reticle stage 5, there are three wafer stage interferometers 23 that are used to control the wafer stage 16 in the X and Y directions.

Similarly to the lens barrel base 13, the stage base 17 is slightly floating in the air above the base plate 18. The stage base 17 removes vibration transmitted from the floor via the base plate 18 to the wafer stage 16, cushions the reaction force exerted when the wafer stage 16 is driven, and releases the force to the base plate 18. The wafer stage 16 is slightly floating in the air above the stage base 17.

The reticle focus measuring device 22 measures the position, in the focus direction, of the patterned surface of the reticle 6 that is sucked by the reticle stage 5. The reticle focus measuring device 22 is a focus measurement sensor that has a plurality of measuring points in a direction perpendicular to the sheet of FIG. 1, and, similarly to the focus detector 14, it measures the center of gravity of the reflection light.

The movement of the reticle stage 5 in the Y direction, in which the position thereof is measured by the laser interferometers 10, enables the focus measurement (measurement of position in the Z-axis direction) of the patterned surface of the reticle 6 at an arbitrary position in the Y direction. The focus measurement information of the reticle 6 is stored in a storage apparatus (not shown) and is used to correct the target position orbit in the focus/tilt (Z, ωX, and ωY) directions of the wafer stage 16 that performs scanning during exposure of the wafer 21.

Figure 2:
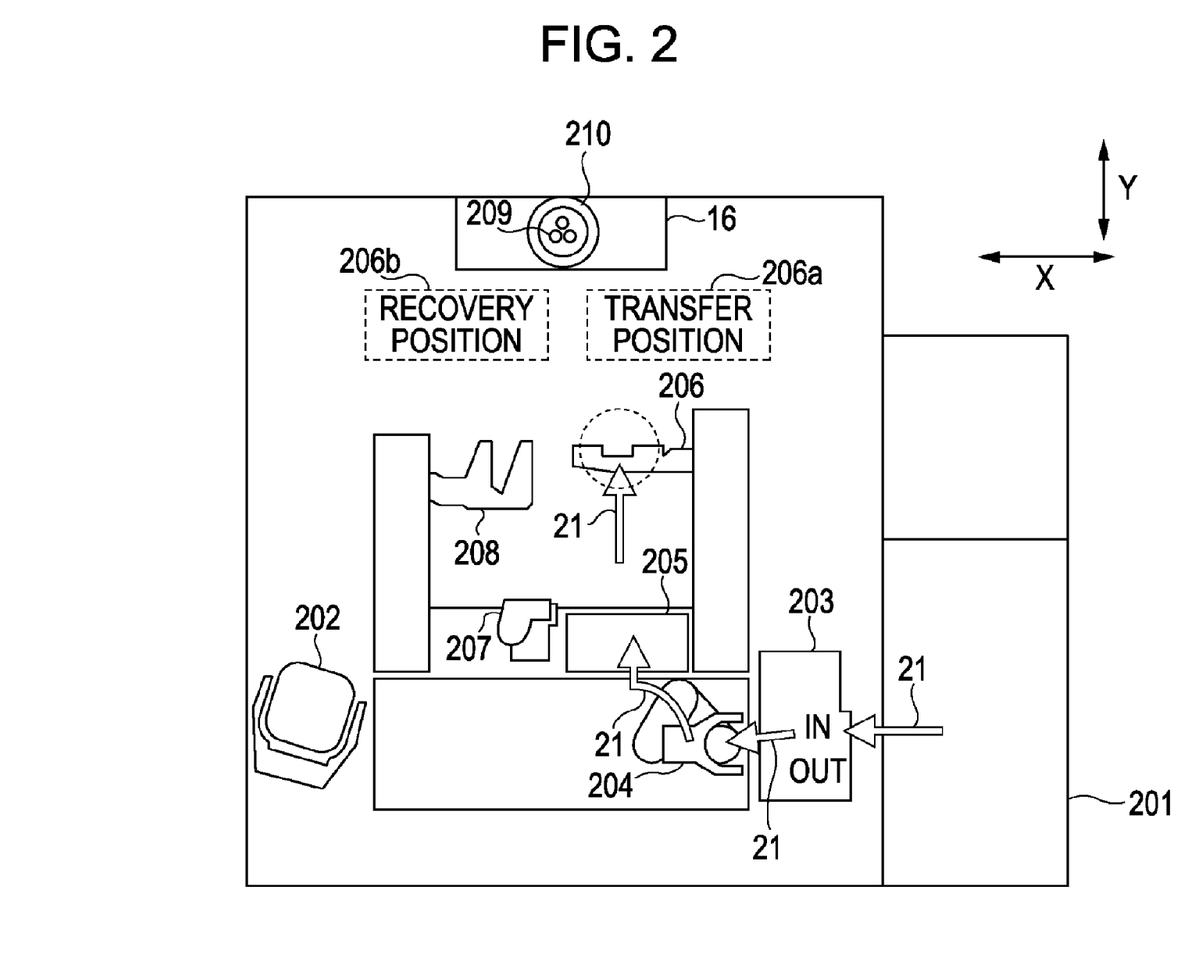
FIG. 2 shows a configuration of a wafer conveying unit.

Referring to FIG. 2, a wafer carry-in sequence with a conveying unit of the exposure apparatus according to this embodiment will be described.

The wafer 21 carried in from the outside of the exposure apparatus according to this embodiment is sent from, for example, a coater developer 201 to an in-line unit 203 and is carried in by a wafer carry-in hand 204. The wafer 21 may alternatively be carried in from an open cassette elevator 202 by the wafer carry-in hand 204. In either case, the wafer carry-in hand 204 transfers the wafer 21. Then, the wafer 21 is conveyed from the wafer carry-in hand 204 to a pre-alignment unit 205.

The pre-alignment unit 205 includes a mechanical pre-alignment stage (not shown) for carrying the wafer 21 and a sensor (not shown) for measuring the position of the wafer 21, and measures the position of the wafer 21 with the sensor. On the basis of the measurement result, the mechanical pre-alignment stage performs correction driving and, at the corrected position, transfers the wafer 21 to a wafer loading hand 206. Then, the wafer loading hand 206 transfers the wafer 21 to a transfer position 206a, where the wafer 21 is transferred to transferring pins 209 of the wafer stage 16. Then, the wafer 21 is transferred from the transferring pins 209 to the chuck 210 to be sucked by vacuum.

An error of holding of the wafer 21 on the chuck 210 is detected at this time. On the other hand, the wafer 21 that is properly sucked by the chuck 210 with vacuum is subjected to, in sequence, coarse alignment measurement and precise alignment measurement, whereby high-accuracy positioning for exposure of the shots is possible.

Figure 3:
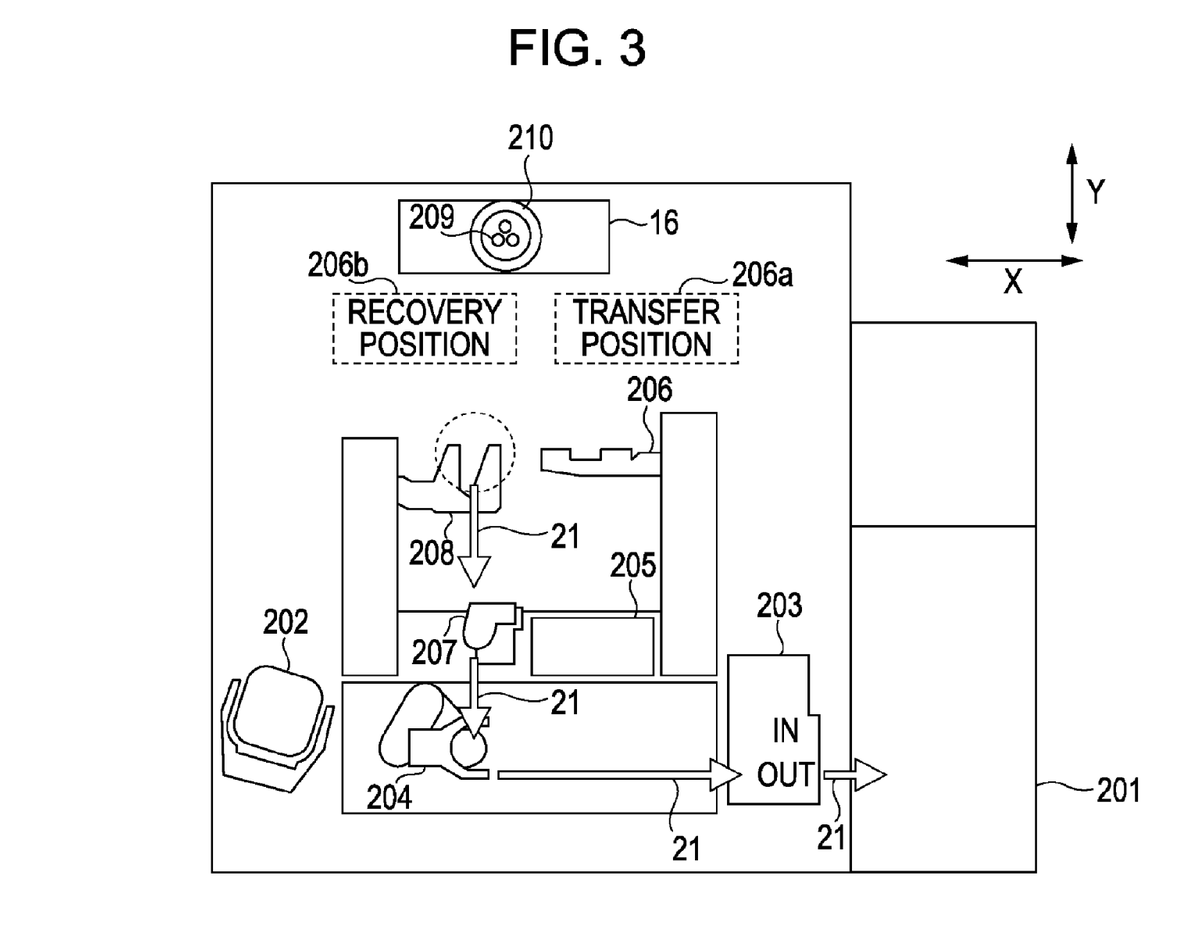
FIG. 3 shows a configuration of the wafer conveying unit.

Referring to FIG. 3, a wafer carry-out sequence with the conveying unit of the exposure apparatus according to this embodiment will be described.

A wafer recovery hand 208 recovers the wafer 21 from the wafer stage 16. A recovery position 206b is located next to the transfer position 206a, and the recovery position 206b is a position where the wafer recovery hand 208 can recover the wafer 21. The wafer 21 on the wafer stage 16 is transferred from the chuck 210 to the transferring pins 209, and the wafer stage 16 is driven and stands by at the recovery position 206b. The wafer recovery hand 208 receives the wafer 21 that is standing by at the recovery position 206b.

Then, the wafer recovery hand 208 transfers the wafer 21 to a wafer recovery station 207, where the wafer carry-in hand 204 receives the wafer 21. Thereafter, the wafer carry-in hand 204 conveys the wafer 21 to the open cassette elevator 202 or the in-line unit 203.

Figure 4:
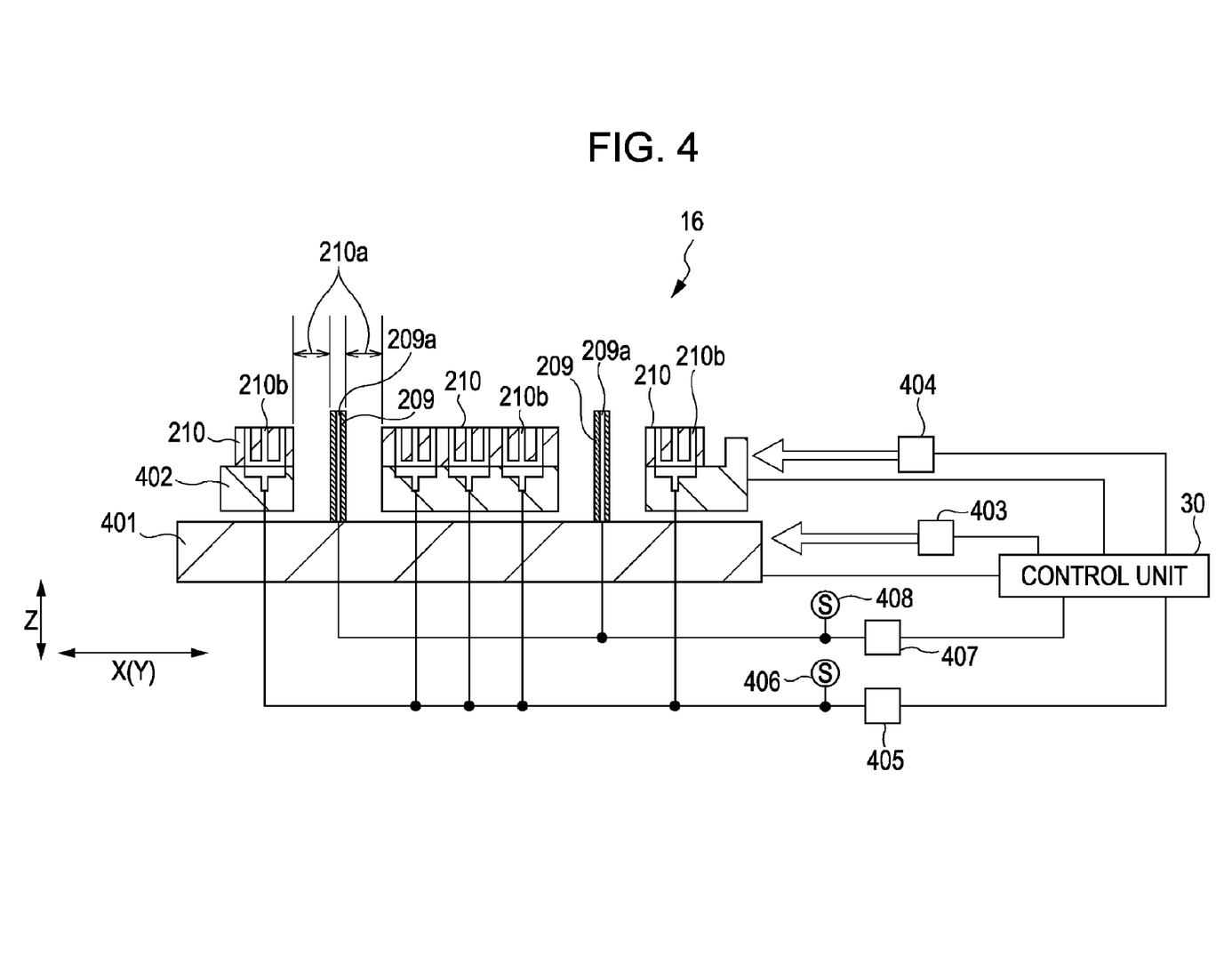
FIG. 4 shows a detailed configuration of a wafer stage.

Referring to FIG. 4, the wafer stage 16, serving as a substrate stage constituting the exposure apparatus according to this embodiment, will be described. The wafer stage 16 includes a coarse-motion stage 401 for coarse positioning, a fine-motion stage 402 that makes fine movements on the coarse-motion stage 401, and the chuck 210 that sucks the wafer 21 on the fine-motion stage 402. The coarse-motion stage 401 includes the transferring pins 209, which are lifting portions that are raised and lowered through though-holes provided in the chuck 210 and suck the wafer 21 with vacuum while being raised from the chuck 21. The fine-motion stage 402 includes the chuck 210 and is supported by the coarse-motion stage 401.

The coarse-motion stage interferometer 403 and the fine-motion stage interferometer 404 measure the positions of the coarse-motion stage 401 and the fine-motion stage 401, respectively, and can set different target values to drive them.

The chuck 210 has suction ports 210b that suck the wafer 21 with vacuum at the upper end, and the suction pressure is measured with a wafer vacuum pressure detection unit 405. An error of holding of the wafer is detected by a wafer vacuum sensor 406, serving as a first detecting unit. When the wafer vacuum sensor 406 detects an error, a control unit 30 causes the focus detector 14 to measure the amount of positional deviation, and, on the basis of the measured amount of positional deviation, controls the movement of the wafer stage 16 such that the amount of positional deviation falls within the tolerance.

The transferring pins 209 are provided on the coarse-motion stage 401 and, while sucking the wafer 21, are raised and lowered so as to project from the chuck 210 to raise the wafer 21 from the chuck 210 and so as to retract from the chuck 210 to suck the wafer 21 by the chuck 210. The transferring pins 209 move when the wafer 21 is transferred from the chuck 210 to the wafer recovery hand 208 of the conveying unit shown in FIGS. 2 and 3.

The transferring pins 209 have the suction ports 209a that suck the wafer 21 with vacuum at the upper ends, and the suction pressure is measured with a pin vacuum pressure detector 407. A pin vacuum error is detected by a pin vacuum sensor 408, serving as a second detecting unit. The pin vacuum sensor 408 detects an error of holding of the wafer 21 with the transferring pins 209.

The control unit 30 controls the operations of the above-described components and, when the pin vacuum sensor 408 does not detect the error and the wafer vacuum sensor 406 detects the error, causes the focus detector 14 to measure the amount of positional deviation. Furthermore, the control unit 30, while the transferring pins 209 suck the wafer 21 with vacuum, causes the wafer stage 16 to position the wafer 21 on the basis of the measured amount of positional deviation, and causes the wafer recovery hand 208 to recover the positioned wafer 21.

There are gaps 210a between the transferring pins 209 and the fine-motion stage 402 and chuck 210. These gaps 210a serve to drive the wafer 21 on the chuck 210 in the Z direction and to inchworm drive the wafer 21 (to drive the wafer 21 in a worm like manner). In the inchworm drive, when an error of holding of the wafer 21 on the chuck 210 occurs, the coarse-motion stage 401 is driven in the X-Y plane on the basis of the position information of the wafer 21, while the transferring pins 209 suck the wafer 21.

Furthermore, while the transferring pins 209 are retracted from the chuck 210 so that the wafer 21 is sucked by the chuck 210, the wafer 21 and the fine-motion stage 402 are driven in the X-Y plane. By performing this series of operations (inchworm drive) at least once, the relative position of the wafer 21 and the chuck 210 is corrected. Then, the wafer 21 is moved by the wafer recovery hand 208 to the recovery position 206b.

This mechanism of the inchworm drive can also be used to correct the position error in the ωZ direction identified by the above-mentioned coarse alignment measurement.

Next, an operation of moving the wafer 21 to the recovery position 206b when an error of holding of the wafer 21 on the chuck 210 occurs on the wafer stage 16 will be described.

First, an error of holding of the wafer 21 on the chuck 210 is detected by the wafer vacuum sensor 406. Next, whether or not the transferring pins 209 can suck the wafer 21 is determined on the basis of the suction pressure of the pin vacuum pressure detector 407. When the suction pressure is equal to or less than a predetermined threshold, the wafer 21 can be conveyed while being sucked by the transferring pins 209. When the suction pressure of the pin vacuum exceeds the threshold, the wafer 21 is not recovered automatically by the wafer stage 16, but is recovered manually.

When suction of the wafer 21 with the transferring pins 209 is possible, the position of the wafer 21 with respect to the chuck 210 is measured with the focus detector 14. Although the original purpose of the focus detector 14 is to detect the position of the surface of the wafer 21 in the Z direction, by measuring the intensity of reflection light from a plurality of portions in the vicinity of the periphery (edge) of the wafer 21 with the focus detector 14, the positions of the plurality of portions on the edge of the wafer 21 can be specified on the basis of the difference in reflectivity between the wafer 21 and the chuck 210.

Then, on the basis of the specified positions of the plurality of portions on the edge, the amount of positional deviation of the wafer 21 with respect to the chuck 210 can be determined. To measure the amount of positional deviation, the method disclosed in Published Japanese Patent Application No. 2007-031516, which is filed by the applicant, may also be used. On the basis of the amount of deviation of the wafer 21 and the position of the wafer stage 16, the position of the wafer 21 in the XY direction can be determined.

Figure 5:
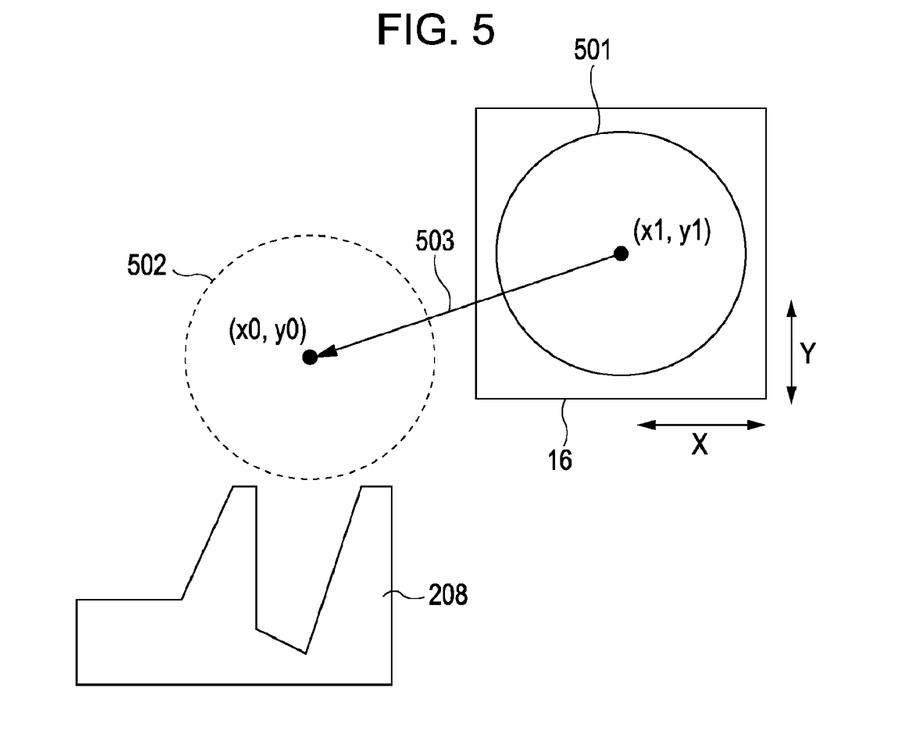
FIG. 5 shows a driving direction of the wafer stage in a wafer recovery sequence.

Then, in this embodiment, on the basis of the position information of the wafer 21 obtained with the focus detector 14, the driving amount of the wafer stage 16 is determined, and the wafer 21 is moved to the recovery position 206b. FIG. 5 shows an example of a driving direction 503 in which the wafer stage 16 is driven when a wafer vacuum error occurs. To recover the wafer 21 by the wafer recovery hand 208, the wafer stage 16 is driven in the driving direction 503 to move the wafer 21 to a position 502. The center coordinate of the position 502 is (X0, y0).

When a wafer vacuum error occurs, as described above, the position of the wafer 21 is measured with the focus detector 14. As a result, if a position 501 of the wafer 21 with respect to the center coordinate of the wafer 21 when the wafer vacuum error occurs is (x1, y1), the wafer stage 16 can drive the wafer 21 such that the center coordinate thereof moves toward the driving target coordinate (X0, y0). Thus, the wafer 21 is moved to a position where it can be recovered by the wafer recovery hand 208.

Because this embodiment is based on a precondition that the wafer 21 can be sucked by the pin vacuum of the transferring pins 209, the wafer stage 16 is moved to the recovery position at a low speed while the wafer 21 is sucked by the pin vacuum.

Although the wafer 21 can be moved by driving the wafer stage 16 as described above, depending on the direction and amount of deviation of the wafer 21 and the chuck 210, the wafer 21 may not be recovered by the wafer recovery hand 208.

Figure 6:
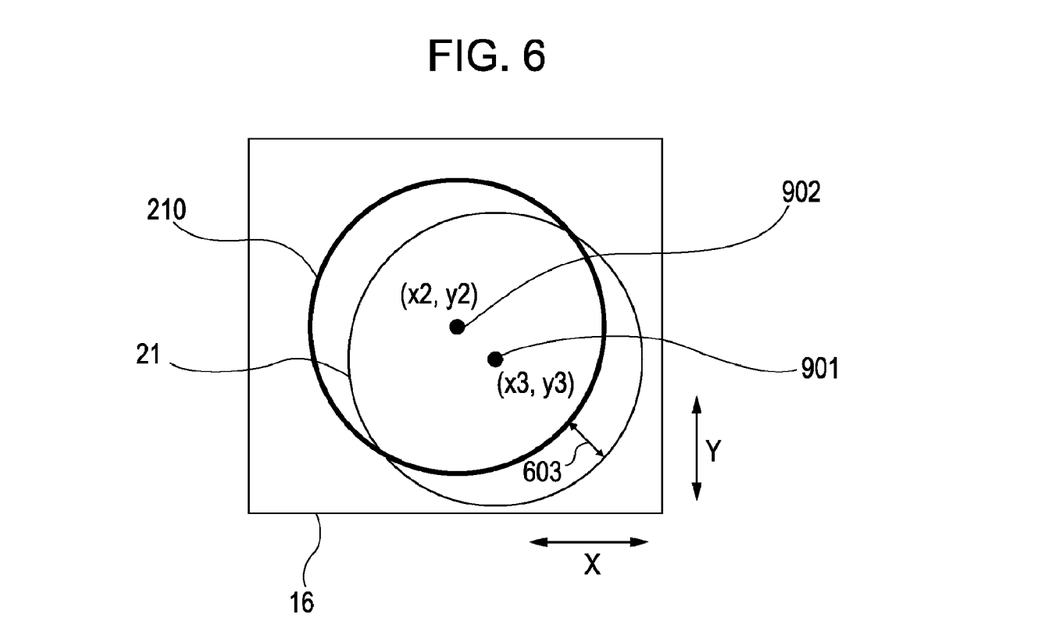
FIG. 6 shows a state in which a wafer is sucked by a wafer chuck in a deviated manner.

FIG. 6 shows an example in which the wafer 21 is sucked by the chuck 210 in a deviated state on the wafer stage 16. The wafer 21 is disposed on the chuck 210, and a center 902 of the chuck 210 and a center 901 of the wafer 21 disagree, producing a deviation 603.

Figure 7:
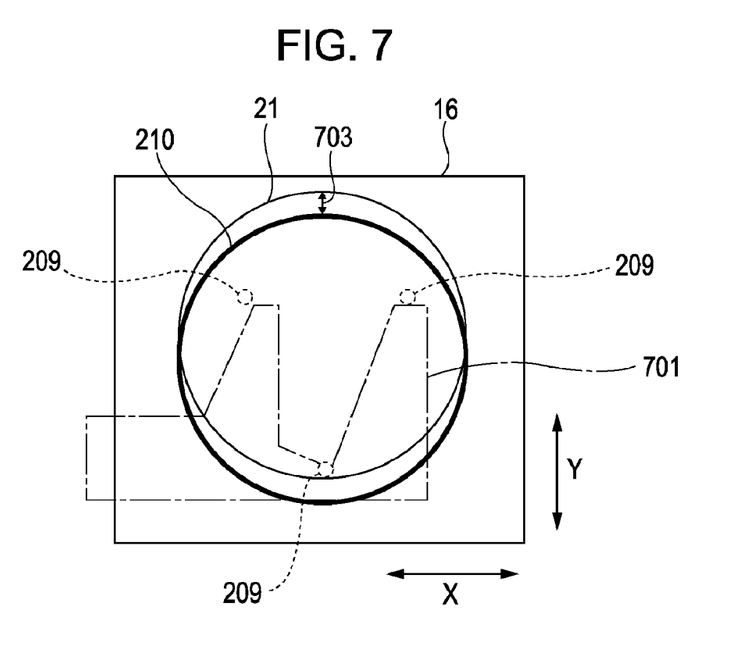
FIG. 7 shows interference between transferring pins and a recovery hand.

FIG. 7 shows an example in which the transferring pins 209 interfere with the wafer recovery hand 208 due to a deviation 703 between the chuck 210 and the wafer 21 when the wafer is recovered by the wafer recovery hand 208. To receive the wafer 21 by the wafer recovery hand 208, the wafer stage 16 has to be moved downward in FIG. 7 by the amount equivalent to the deviation 703, compared with the case where there is no deviation between the wafer 21 and the chuck 210. However, in this case, if the wafer recovery hand 208 is moved to the position 701, the wafer recovery hand 208 interferes with the transferring pins 209.

Figure 8:
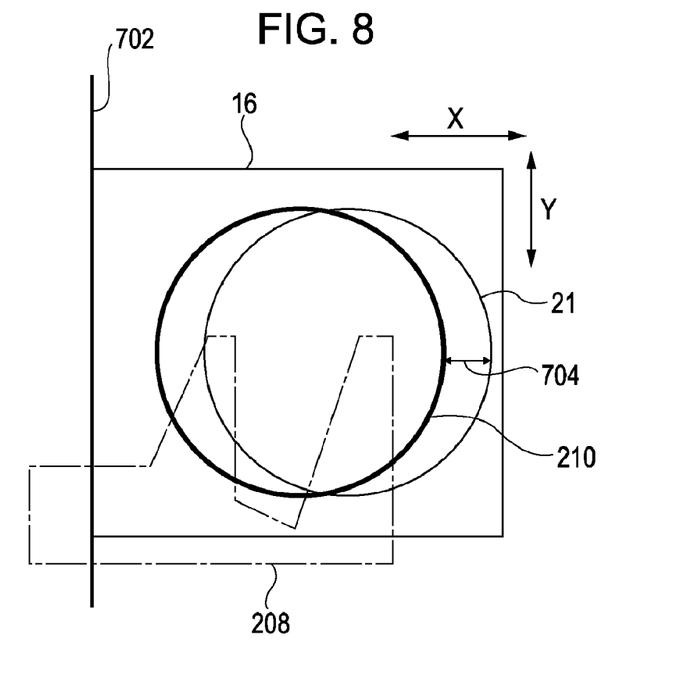
FIG. 8 shows the wafer stage having moved to the limit of the stroke.

FIG. 8 also shows an example in which the wafer 21 cannot be recovered because the wafer 21 is sucked by the chuck 210 in a deviated state.

In FIG. 8, the wafer 21 is sucked in such a manner that it is deviated rightward in FIG. 8 by a deviation 704 with respect to the chuck 210. Thus, to receive the wafer 21 by the wafer recovery hand 208, the wafer stage 16 has to be driven further leftward in FIG. 8 by the amount equivalent to the deviation 704 to move the wafer 21 leftward in FIG. 8.

However, because the wafer stage 16 has already moved to a limit value (limit position) 702 of the movement stroke, it cannot move leftward in FIG. 8. In general, such a situation occurs when the position of the wafer stage 16, at the time when a wafer is recovered in normal condition, is designed to be the limit value of the stroke in order to reduce the area occupied by the apparatus in a design case. As described above, the wafer 21 may not be recovered by the wafer recovery hand 208 because the wafer 21 is sucked by the chuck 210 in a deviated state.

From these examples, in order to automatically recover the wafer 21 that is sucked by the chuck 210 in a deviated state, it is insufficient to correct the position of the wafer stage 16 during recovery of the wafer 21. Therefore, it is effective to shift and correct the relative positions of the chuck 210 and the wafer 21.

In order to correct the relative positions of the chuck 210 and the wafer 21, the above-described inchworm drive in the X-Y plane may be performed.

In this embodiment, while the chuck 210 holds the wafer 21, the position of the fine-motion stage 402 in the X-Y plane with respect to the transferring pins 209 (coarse-motion stage 401) is changed. As described above with reference to FIG. 4, the coarse-motion stage 401 and the fine-motion stage 402 can be set to and positioned at different target positions by the coarse-motion stage interferometer 403 and the fine-motion stage interferometer 404, respectively.

Referring to FIGS. 9A to 9E, an operation of the inchworm drive of the wafer stage 16 in the X-Y plane, shown in FIG. 4, will be described.

FIGS. 9A to 9E show a sequence of the inchworm drive, which is an example in which the wafer 21 is shifted rightward in FIGS. 9A to 9E with respect to the chuck 210.

Figure 9A:
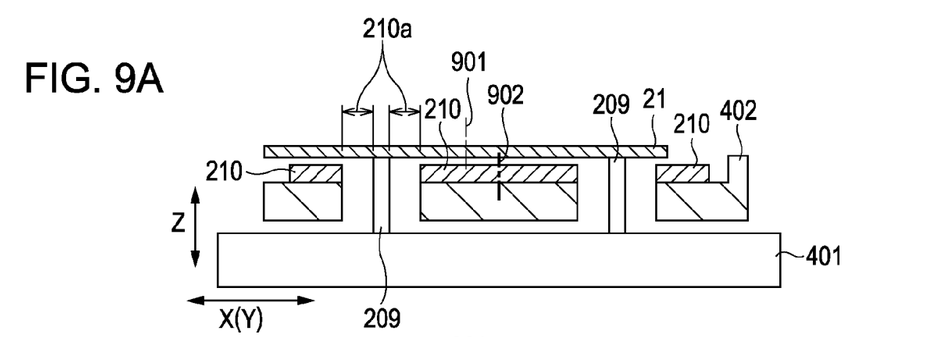
FIGS. 9A to 9E show inchworm drive of the wafer stage.
Figure 9B:
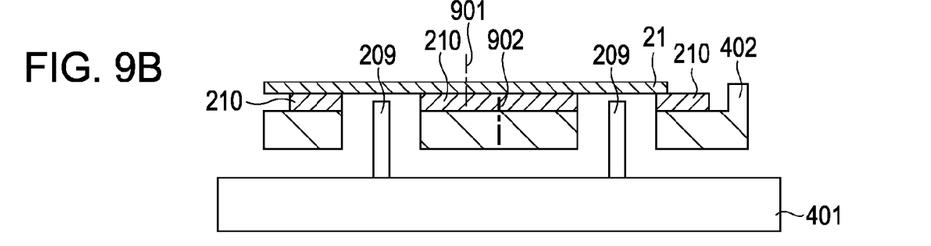

In FIG. 9A, the wafer 21 is sucked by the transferring pins 209 in such a manner that the center 901 of the wafer 21 is deviated leftward in FIGS. 9A to 9E with respect to the center 902 of the chuck 210. When the fine-motion stage 402 is moved upward in the Z direction from the state of FIG. 9A, the wafer 21 is transferred to the chuck 210; this state is shown in FIG. 9B.

Figure 9C:
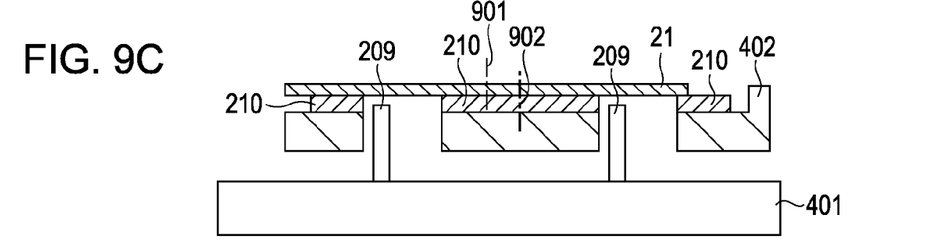
Figure 9D:
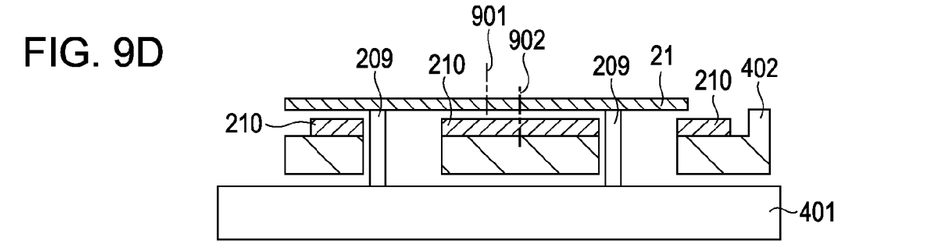
Figure 9E:
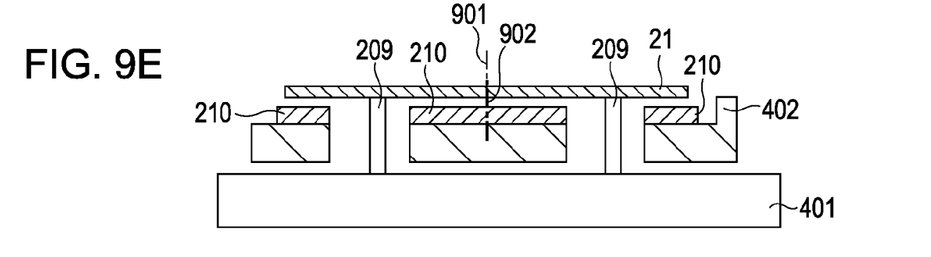

From the state of FIG. 9B, the fine-motion stage 402 is shifted rightward in FIGS. 9A to 9E; this state is shown in FIG. 9C. From the state of FIG. 9C, when the fine-motion stage 402 is moved downward in the Z direction, the wafer 21 is transferred from the chuck 210 to the transferring pins 209; this state is shown in FIG. 9D. From the state of FIG. 9D, the fine-motion stage 402 is shifted leftward in FIGS. 9A to 9E; this state is shown in FIG. 9E. Although FIGS. 9A to 9E show the method of moving the wafer 21 rightward with respect to the chuck 210, the wafer 21 may also be shifted in another direction in the X-Y plane by changing the direction in which the fine-motion stage 402 is shifted.

Furthermore, by repeating the operation of FIGS. 9A to 9E, the distance by which the wafer 21 is shifted can be increased. Assuming that inchworm drive corresponding to one sequence of FIGS. 9A to 9E can shift the wafer 21 about 100 μm at most, the operation shown in FIGS. 9A to 9E should be repeated 100 to 150 times to shift the wafer 21 by 10 mm to 15 mm. Because one inchworm drive takes about a second, the time taken to shift the wafer 21 by 10 mm to 15 mm is about 100 to 150 seconds. Compared to the case where the wafer 21 is recovered manually, the time required for the recovery of the apparatus is significantly reduced and the safety improves.

To enable automatic recovery of the wafer 21 by the wafer recovery hand 208, the distance by which the wafer 21 is shifted by inchworm drive is automatically determined on the basis of the positional deviation information of the wafer 21 determined using the focus detector 14 upon the occurrence of a wafer vacuum error.

During inchworm drive, the wafer 21 is transferred from the chuck 210 to the transferring pins 209, and new deviation between the wafer 21 and the chuck 210 may occur at this time. If the amount of the new deviation is predictable, a correction value may be added in advance to the amount of inchworm drive.

However, if the amount of the new deviation is unpredictable, the amount of positional deviation of the wafer 21 with respect to the chuck 210 may be measured after the inchworm drive, and the inchworm drive may be repeated until the amount of positional deviation becomes such an amount that enables recovery of the wafer 21 by the wafer recovery hand 208. At this time, an operator may determine the amount of inchworm drive and input it to the control apparatus 30 so that the inchworm drive is performed. A series of operations, i.e., the measurement of the positional deviation of the wafer 21 with respect to the chuck 210, input of the amount of inchworm drive, and the inchworm drive, is performed at least once, until the amount of positional deviation becomes such an amount that enables recovery of the wafer 21 by the wafer recovery hand 208.

Figure 10:
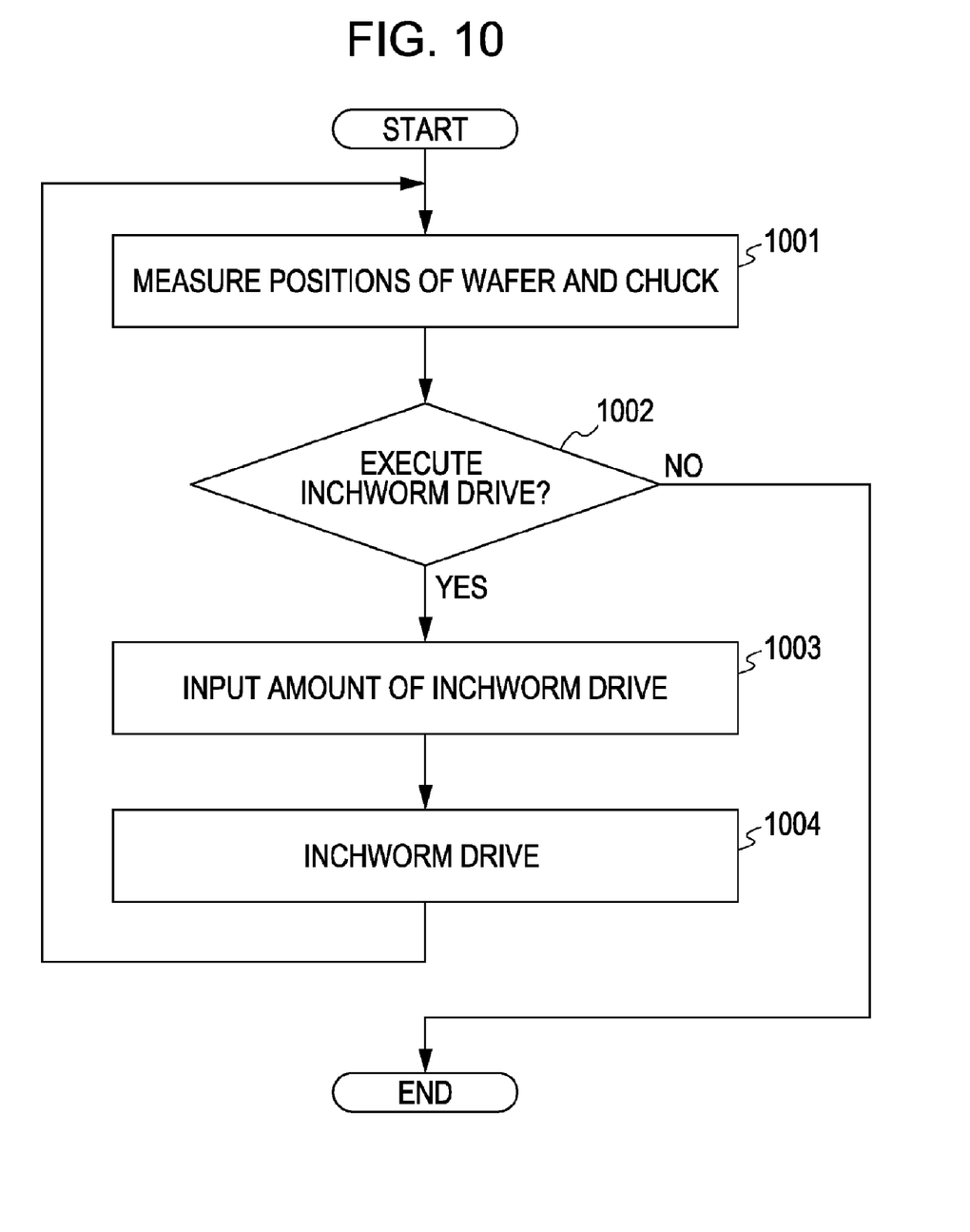
FIG. 10 is a flowchart showing the flow of performing the inchworm drive.

FIG. 10 shows a processing flow of a case in which an operator inputs the amount of inchworm drive to the control apparatus 30.

First, in step S1001, the positional deviation of the wafer 21 with respect to the chuck 210 is measured, and the information is shown to the operator through a display unit or the like. In step S1002, whether or not the operator has instructed the execution of inchworm drive is determined.

If it is determined that the operator has instructed the execution of inchworm drive, the amount of inchworm drive instructed by the operator is input through an input device in step S1003, and then the inchworm drive is executed in step S1004. After the inchworm drive, the processing is repeated from step S1001. If it is determined that the operator has not instructed the execution of inchworm drive in step S1002, the processing is terminated.

Another embodiment for making the amount of deviation between the center of the wafer 21 and the center of the chuck 210 fall within the tolerance without performing inchworm drive will be described below.

That is, while the suction of the wafer 21 by the chuck 210 is turned off, the fine-motion stage 402 is driven in the X-Y plane to change the relative positions of the wafer 21 and the chuck 210.

Alternatively, while the chuck 210 carries the wafer 21, the wafer vacuum is turned off and the wafer stage 16 is step-driven in the X-Y plane. The step driving of the wafer stage 16 causes inertial force to act on the wafer 21, shifting the position of the wafer 21 with respect to the chuck 210 in a direction opposite to the direction in which the wafer stage 16 is step-driven.

That is, the control unit 30 causes the wafer stage 16 to perform a first relative movement between the fine-motion stage 402 and the coarse-motion stage 401 while the chuck 210 holds the wafer 21 and a second relative movement between the fine-motion stage 402 and the coarse-motion stage 401 while the transferring pins 209 hold the wafer 21, in a direction opposite to the first relative movement, such that the amount of positional deviation falls within the tolerance.

Figure 11:
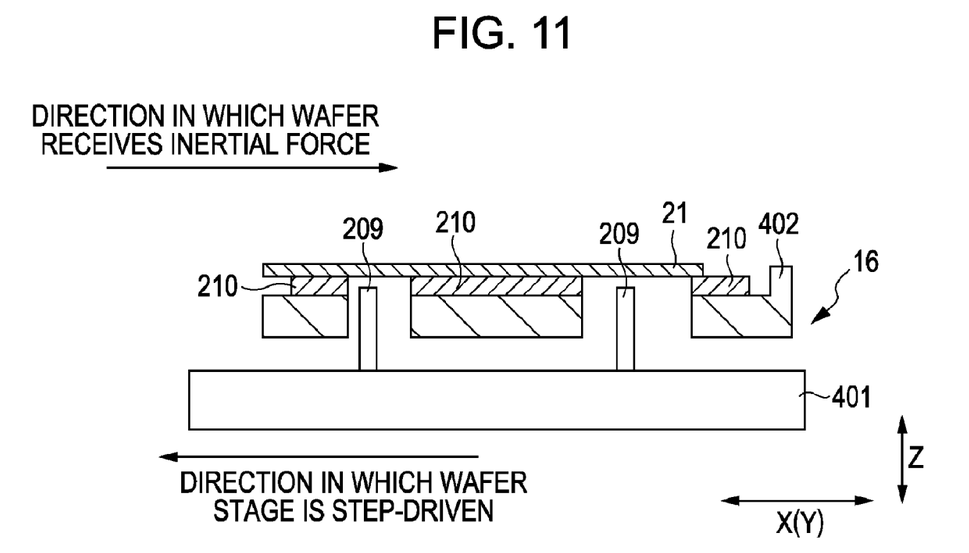
FIG. 11 shows the movement of the wafer by step driving.

FIG. 11 shows an example of directions in which the wafer stage 16 is step-driven and in which the wafer 21 is shifted.

When the stage is step-driven leftward in FIG. 11, inertial force acts on the wafer 21 rightward in FIG. 11, shifting the wafer 21 rightward with respect to the chuck 210. The acceleration and driving distance of the wafer stage 16 during step driving are determined according to the coefficient of friction between the wafer 21 and the chuck 210 and to the weight of the wafer 21. That is, while the vacuum suction is turned off, the control unit 30 causes the wafer stage 16 to perform accelerating movement such that the amount of positional deviation falls within the tolerance.

In addition, the following method may be employed to shift the position of the wafer 21 with respect to the chuck 210.

First, while the wafer 21 is sucked by the chuck 210, the wafer vacuum is turned off and the wafer stage 16 is driven downward in the Z direction. This causes the wafer 21 to float from the chuck 210. When the wafer stage 16 is driven in the X-Y plane while the wafer 21 is floating, the position of the wafer 21 with respect to the chuck 210 is shifted.

Then, when the wafer 21 falls on the chuck 210 due to gravity, by receiving the wafer 21 while driving the wafer stage 16 downward in the Z direction, an impact on the wafer 21 is reduced. With any of the above-described methods, the amount of deviation of the wafer 21 with respect to the chuck 210 can be made to fall within the tolerance.

According to this embodiment, the wafer 21 having moved to the recovery position 206b is carried out to the outside of the apparatus in accordance with the carry-out sequence described above with reference to FIG. 3.

That is, first, the wafer 21 is held by the wafer recovery hand 208. Then, the wafer 21 is transferred by the wafer recovery hand 208 to the wafer recovery station 207 and is held by the wafer carry-in hand 204. The wafer carry-in hand 204 conveys the wafer 21 to the open cassette elevator 202 or the in-line unit 203. Then, the wafer 21 is carried out to the outside.

According to this embodiment, the frequency of recovering wafers manually can be reduced or the time required therefor can be reduced.

Next, a method of manufacturing a device (semiconductor device, liquid crystal display device, etc.) as an embodiment of the present invention is described. The semiconductor device is manufactured through a front-end process in which an integrated circuit is formed on a wafer, and a back-end process in which an integrated circuit chip is completed as a product from the integrated circuit on the wafer formed in the front-end process. The front-end process includes a step of exposing a wafer with a photoresist coated thereon to light using the above-described exposure apparatus of the present invention, and a step of developing the exposed wafer. The back-end process includes an assembly step (dicing and bonding), and a packaging step (sealing).

The liquid crystal display device is manufactured through a process in which a transparent electrode is formed. The process of forming a transparent electrode includes a step of coating a photoresist on a glass substrate with a transparent conductive film deposited thereon, a step of exposing the glass substrate with the photoresist coated thereon to radiant energy (light, x-ray, charged-particle beam, etc.) using the above-described exposure apparatus, and a step of developing the exposed glass substrate.

The device manufacturing method of this embodiment has an advantage, as compared with a conventional device manufacturing method, in at least one of performance, quality, productivity and production cost of a device.

While desirable embodiments of the present invention have been described above, it is to be understood that the present invention is not limited to the disclosed exemplary embodiments. Any modification or variation within the scope of the present invention should be possible.

This application claims priority from Japanese Patent Application No. 2008-224172, entitled "exposure apparatus and device manufacturing method" and filed on Sep. 1, 2008, the entire contents of which are incorporated herein by reference.

What is claimed is:

1. An exposure apparatus for exposing a substrate to radiant energy, the apparatus comprising:
    a substrate stage including a chuck, and configured to hold the substrate on the chuck with a first vacuum and to be moved, the substrate stage including a coarse-motion stage that includes a lifting portion configured to be raised and lowered through a through-hole provided in the chuck, and to hold the substrate thereon with a second vacuum with the lifting portion raised through the through-hole, and a fine-motion stage that includes the chuck and supported by the coarse-motion stage;
    a first detector configured to detect an error of holding of the substrate on the chuck via measuring of a pressure of the first vacuum;
    a second detector configured to detect an error of holding of the substrate on the lifting portion via measuring of a pressure of the second vacuum;
    a measuring device configured to measure an amount of positional deviation of the substrate relative to the chuck; and
    a controller configured to cause, if the first detector detects the error of holding of the substrate on the chuck and then the second detector does not detect the error of holding of the substrate on the lifting portion, the substrate stage to be moved with the substrate held by the lifting portion, and to cause the measuring device to measure the amount of positional deviation of the substrate on the moved substrate stage with the substrate held by the lifting portion.

2. An apparatus according to claim 1,
    wherein the controller is configured to cause the stage to perform relative movement between the fine-motion stage and the coarse-motion stage with the substrate held by the lifting portion, such that the amount of positional deviation falls within the tolerance based on the measured amount.

3. An apparatus according to claim 1,
    wherein the controller is configured to cause the substrate stage to perform accelerated motion with the substrate on the chuck without vacuum, such that the amount of positional deviation falls within the tolerance based on the measured amount.

4. An apparatus according to claim 1,
    wherein the measuring device is configured to project light onto the substrate, to detect light reflected from the substrate, and to determine each of positions of a plurality of portions on the periphery of the substrate based on the detected light.

5. An apparatus according to claim 1,
    wherein the controller is configured to cause the substrate stage to perform, as the relative movement, a first relative movement between the fine-motion stage and the coarse-motion stage with the substrate on the chuck and a second relative movement, in a direction opposite to that of the first relative movement, between the fine-motion stage and the coarse-motion stage with the substrate held by the lifting portion, such that the amount of positional deviation falls within the tolerance.

6. The apparatus according to claim 1, further comprising a recovery device configured to recover the substrate from the substrate stage,
    wherein the controller is configured to cause the recovery device to recover the substrate of which the amount of positional deviation is within the tolerance.

7. A method of manufacturing a device, the method comprising:
    exposing a substrate to radiant energy using an exposure apparatus;
    developing the exposed substrate; and
    processing the developed substrate to manufacture the device,
    wherein the exposure apparatus includes:
    a substrate stage including a chuck, and configured to hold the substrate on the chuck with a first vacuum and to be moved, the substrate stage including a coarse-motion stage that includes a lifting portion configured to be raised and lowered through a through-hole provided in the chuck, and to hold the substrate thereon with a second vacuum with the lifting portion raised through the through-hole, and a fine-motion stage that includes the chuck and supported by the coarse-motion stage;
    a first detector configured to detect an error of holding of the substrate on the chuck via measuring of a pressure of the first vacuum;
    a second detector configured to detect an error of holding of the substrate on the lifting portion via measuring of a pressure of the second vacuum;
    a measuring device configured to measure an amount of positional deviation of the substrate relative to the chuck; and
    a controller configured to cause, if the first detector detects the error of holding of the substrate on the chuck and then the second detector does not detect the error of holding of the substrate on the lifting portion, the substrate stage to be moved with the substrate held by the lifting portion, and to cause the measuring device to measure the amount of positional deviation of the substrate on the moved substrate stage with the substrate held by the lifting portion.

* * * * *